(12) United States Patent
Inoguchi

(10) Patent No.: US 7,307,288 B2
(45) Date of Patent: Dec. 11, 2007

(54) SEMICONDUCTOR DEVICE AND MANUFACTURING METHOD THEREOF

(75) Inventor: Hiroshi Inoguchi, Gunma (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 0 days.

(21) Appl. No.: 10/936,182

(22) Filed: Sep. 8, 2004

(65) Prior Publication Data

US 2005/0093129 A1  May 5, 2005

(30) Foreign Application Priority Data

Sep. 12, 2003  (JP) ............... P. 2003-321051

(51) Int. Cl.
*H01L 29/24* (2006.01)
*H01L 23/495* (2006.01)

(52) U.S. Cl. ............ 257/100; 257/692; 257/676; 257/98; 257/99; 257/698; 257/696; 257/E33.067; 438/22; 438/25; 438/26; 438/27; 438/29

(58) Field of Classification Search .......... 257/692, 257/693, 696, E33.057, E33.058, E33.059, 257/676, 98, 99, 100, 698; 438/22, 25, 26, 438/27, 29
See application file for complete search history.

(56) References Cited

U.S. PATENT DOCUMENTS 5,367,530 A * 11/1994 Noishiki et al. .......... 372/43.01

| 6,051,784 | A | 4/2000 | Yoon |
| 6,680,525 | B1 * | 1/2004 | Hsieh et al. ............. 257/680 |
| 2002/0109214 | A1 * | 8/2002 | Minamio et al. .......... 257/676 |
| 2002/0163066 | A1 | 11/2002 | Ke et al. |
| 2003/0209815 | A1 * | 11/2003 | Ito et al. ................. 257/797 |

FOREIGN PATENT DOCUMENTS

| CN | 97125471.0 | 7/1997 |
| JP | 11-340257 | 12/1999 |
| JP | 2001-077277 | 3/2001 |
| KR | 2001-0004527 | 1/2001 |

* cited by examiner

*Primary Examiner*—Kenneth Parker
*Assistant Examiner*—Joseph Nguyen
(74) *Attorney, Agent, or Firm*—Fish & Richardson P.C.

(57) ABSTRACT

A semiconductor device capable of incorporating an element configured to accept and emit light having a short wavelength and a manufacturing method thereof are provided. A semiconductor element is housed in an enclosure which includes a bottom portion and side portions and having an aperture on an upper part thereof. Leads are buried in the bottom portion, and an end of each of the leads is arranged so as to approach the semiconductor element. The semiconductor element is connected to the leads by use of metal wires. The aperture of the enclosure is covered with a lid made of a transparent material for transmitting light accepted or emitted by the semiconductor element.

6 Claims, 6 Drawing Sheets

SEMICONDUCTOR DEVICE AND MANUFACTURING METHOD THEREOF

BACKGROUND OF THE INVENTION

Priority is claimed to Japanese Patent Application Number JP2003-321051 filed on Sep. 12, 2003, the disclosure of which is incorporated herein by reference in its entirety.

1. Field of the Invention

The present invention relates to a semiconductor device incorporating a semiconductor element configured to accept and emit light, and to a manufacturing method thereof.

2. Description of the Related Art

A configuration of a conventional semiconductor device 100 will be described with reference to FIGS. 6A and 6B. FIG. 6A is a plan view of the semiconductor device 100 and FIG. 6B is a cross-sectional view thereof.

Referring to FIGS. 6A and 6B, a land 102 made of a conductive material is formed in the central part of the semiconductor device 100, and ends of a plurality of leads 101 approach a periphery of the land 102. An end of each of the leads 101 is electrically connected to a semiconductor element 104 by use of a metal wire 105, and the other end thereof is exposed from sealing resin 103. The sealing resin 103 has a function of sealing and integrally supporting the semiconductor element 104, the land 102, and the leads 101. When an optical element is adopted as the semiconductor element 104, transparent resin for transmitting light is adopted as the sealing resin 103.

However, there are problems when an element configured to emit and accept light having a short wavelength is adopted as the above-described semiconductor element 104. To be more precise, a case where the sealing resin 103 is adversely affected by the light having a short wavelength, and a case where an optical signal is degraded by the sealing resin are conceivable. In the former case, when an element configured to accept and emit light having a short wavelength (such as a blue laser having a wavelength of about 475 nm) is adopted as the semiconductor element 104, the sealing resin 103 may be discolored by the light. Meanwhile, in the latter case, since the sealing resin 103 containing a mold lubricant and the like does not possess sufficient transparency, the light having a short wavelength to be accepted and emitted by the semiconductor element, such as the blue laser, may be attenuated by the sealing resin 103.

SUMMARY OF THE INVENTION

The present invention has been made in consideration of the foregoing problems. A principal object of the present invention is to provide a semiconductor device capable of incorporating an element configured to emit and accept light having a short wavelength, and to provide a manufacturing method thereof.

A semiconductor device of the present invention includes; an enclosure including a bottom portion and side portions and having an aperture on an upper part thereof; a semiconductor element fixed to a surface of the bottom portion and provided with any of a light accepting portion and a light emitting portion on a surface thereof; a lead buried in the bottom portion and arranged so that an end thereof approaches the semiconductor element; a metal wire configured to connect the semiconductor element and the lead; and a lid made of a transparent material for transmitting any of light accepted by the light accepting unit and light emitted by the light emitting portion and configured to occlude the aperture.

A method of manufacturing a semiconductor device of the present invention includes forming units each including a plurality of leads each having a convex portion protruding downward; forming an enclosure provided with an aperture for each of the units, by forming a bottom portion made of resin so as to bury the leads while surfaces of the leads are exposed partially and simultaneously by forming side portions continuously from the bottom portion; fixing a semiconductor element to the bottom portion; connecting the surfaces of the leads in the vicinity of convex portions thereof and the semiconductor element by use of metal wires; occluding the aperture by use of a lid made of a transparent material; and separating each of the units from one another by cutting the leads and the side portions off.

DETAILED DESCRIPTION OF THE PREFERRED EMBODIMENT

Figure 1A:
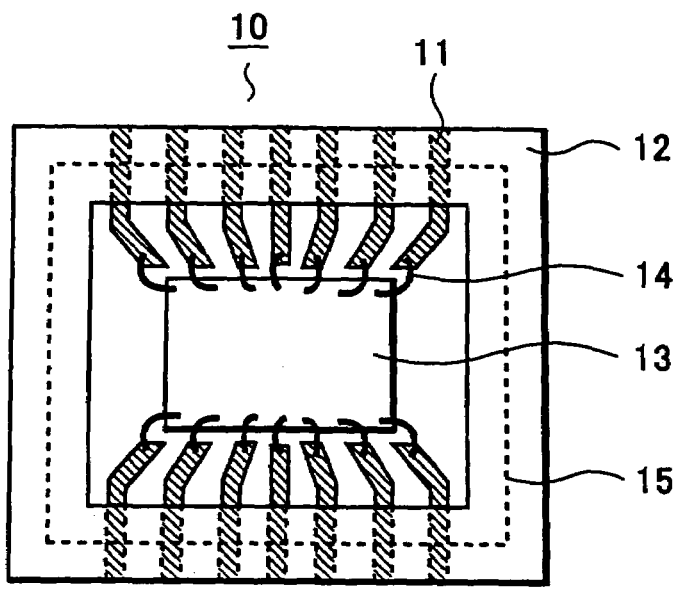
FIG. 1A is a plan view.
Figure 1B:
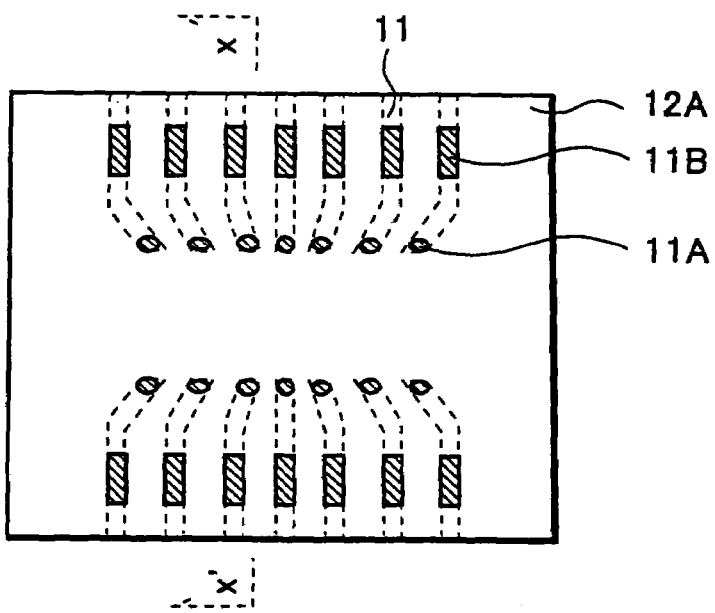
FIG. 1B is a rear view.
Figure 1C:
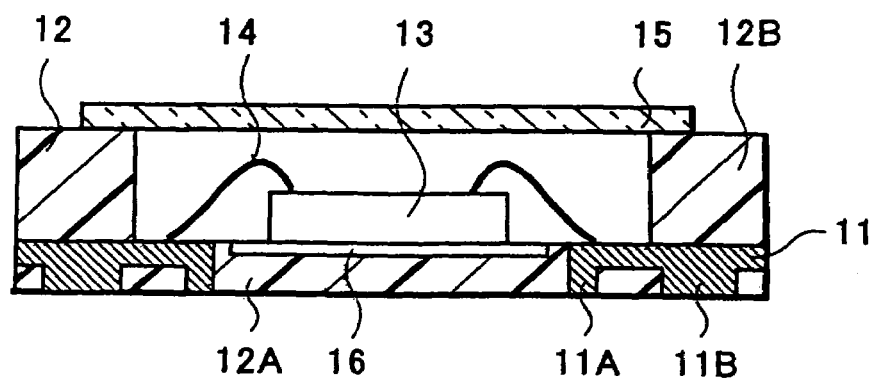
FIG. 1C is a cross-sectional view for showing a semiconductor device of a preferred embodiment.

A detailed configuration of a semiconductor device of a preferred embodiment will be described with reference to FIGS. 1A to 1C. FIG. 1A is a plan view of a semiconductor device 10 of the preferred embodiment, FIG. 1B is a rear view thereof, and FIG. 1C is a cross-sectional view taken along the X-X' line in FIG. 1B.

Referring to the drawings, the semiconductor device 10 of the preferred embodiment includes a bottom portion 12A and side portions 12B. An enclosure 12 houses an optical semiconductor element 13 therein. Moreover, a plurality of leads 11 are buried in the bottom portion 12A of the enclosure 12. One end of each lead 11 approaches the semiconductor element 13. The semiconductor element 13 is connected to the leads 11 by use of metal wires 14. Furthermore, an aperture of the enclosure 12 is occluded by a transparent lid 15.

The enclosure 12 is made of resin, constitutes a space for housing the semiconductor element 13 inside, and has the aperture on an upper part thereof. Meanwhile, the enclosure 12 includes the bottom portion 12A constituting a base of a case, and the side portions 12B extending upward from the periphery of the bottom portion 12A.

Referring to FIG. 1A, one end of each of the leads 11 approaches the semiconductor element 13, and the other end thereof extends to the periphery of the semiconductor device 10. Meanwhile, an interval between the leads 11 on the periphery is longer than an interval between the leads 11 in the vicinity of the semiconductor element 13. Moreover, the plurality of leads 11 extend so as to sandwich the semiconductor element 13 from both end directions. Alternatively, the leads 11 may extend in four directions so as to surround the semiconductor element 13.

A cross-sectional structure of the lead 11 will be described with reference to FIG. 1C. The leads 11 include first convex portions 11A protruding downward in the vicinity of the end close to the semiconductor element 13, and second convex portions 11B protruding downward in the vicinity of the periphery of the semiconductor device 10. The end of the lead 11 which does not approach the semiconductor element 13 (in the vicinity of the periphery) is exposed to the outside from the side portion 12B of the enclosure 12. Moreover, rear surfaces of the first and second convex portions 11A and 11B are exposed from the bottom portion 12A. This condition is shown in FIG. 1B. Meanwhile, the rear surface of the second convex portions 11B which is exposed to the outside functions as an external electrode for establishing electrical connection to the outside by use of brazing material such as solder. Therefore, the interval between the second convex portions 11B is determined in a range capable of avoiding a solder bridge. In the meantime, the first convex portions 11A are also exposed from the rear surface of the enclosure 12. Therefore, an interval between the first convex portion 11A and the second convex portion 11B is set at least as long as the interval between the second convex portions 11B.

The semiconductor element 13 is housed in the enclosure 12 and is fixed to a surface of the bottom portion 12A. Moreover, electrodes of the semiconductor element 13 are electrically connected to the leads 11 by use of the metal wires 14. A light accepting element and/or a light emitting element are formed on a surface of the semiconductor element 13. Here, it is possible to adopt an element configured to accept and emit a high-frequency blue laser having a wavelength of about 475 nm, as the semiconductor element 13.

A concave portion 16 is a region formed by partially indenting the surface of the bottom portion 12A made of the resin, and a planar size thereof corresponds to the size of the semiconductor element 13 to be mounted thereon. Moreover, the semiconductor element 13 is fixed by use of an adhesive such as Ag paste coated on this concave portion 16.

The lid 15 has a role to occlude the aperture of the enclosure 12 from the upper part, and is made of a transparent material for transmitting the light accepted and emitted by the semiconductor element 13. For example, when the semiconductor element 13 is configured to accept and emit the high-frequency blue laser having the wavelength of about 475 nm, a transparent material for transmitting this blue laser is adopted as the material for the lid 15. Glass is a favorable material for the lid 15, for example.

Figure 2A:
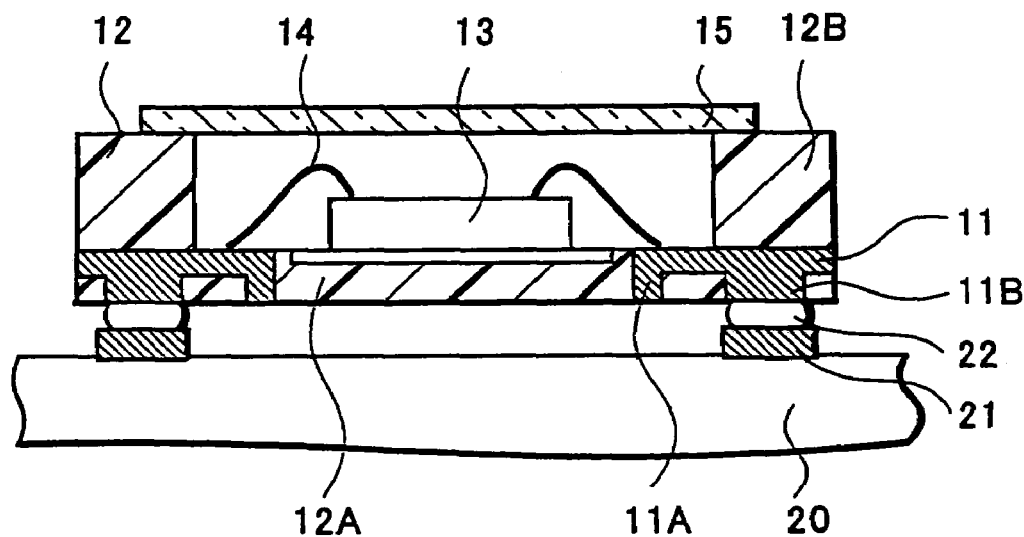
FIG. 2A and FIG. 2B are cross-sectional views for showing the semiconductor device of the preferred embodiment.
Figure 2B:
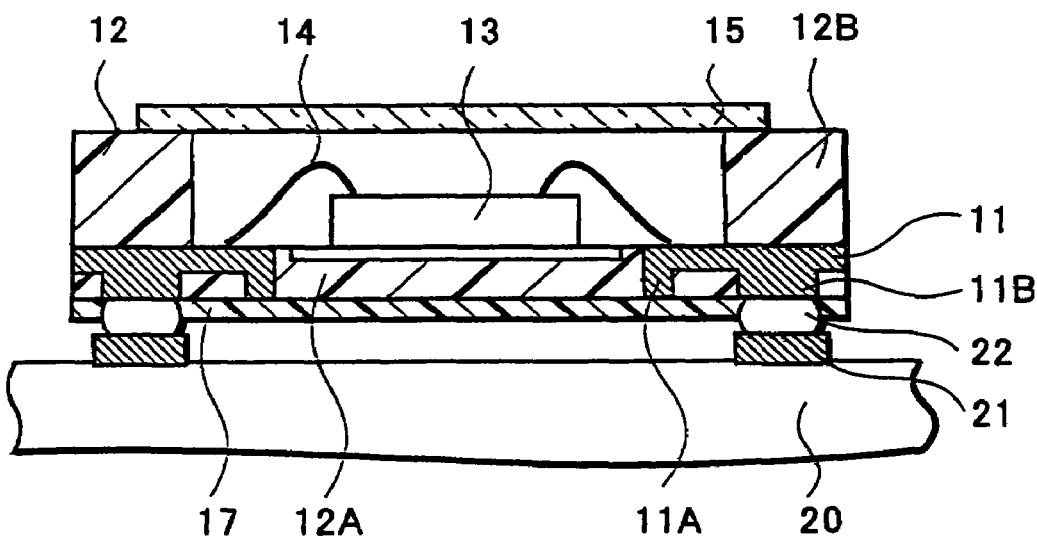

A mounting structure of the above-described semiconductor device 10 will be described with reference to FIGS. 2A and 2B. FIG. 2A and FIG. 2B are cross-sectional views of the semiconductor device 10 mounted on a mounting substrate 20.

Referring to FIG. 2A, the semiconductor device 10 is fixed to conductive paths 21 on the mounting substrate 20 by attaching the brazing material 22 such as solder on the second convex portions 11B exposed to the rear surface of the device. That is, the shape of the brazing material 22 is regulated by utilizing wettability of the exposed portion of the leads 11. Accordingly, a risk of a short circuit by a solder bridge is eliminated.

Referring to FIG. 2B, here, a solder resist 17 is formed on a rear surface of the semiconductor device 10. Apertures are formed on the resist 17 in positions corresponding to the second convex portions 11B, and the brazing material 22 is formed thereon. Accordingly, here, the positions and the shape of the brazing material 22 are regulated by the apertures provided on the resist 17.

A method of manufacturing the above-described semiconductor device 10 will be described with reference to FIGS. 3 to 5.

Figure 3A:
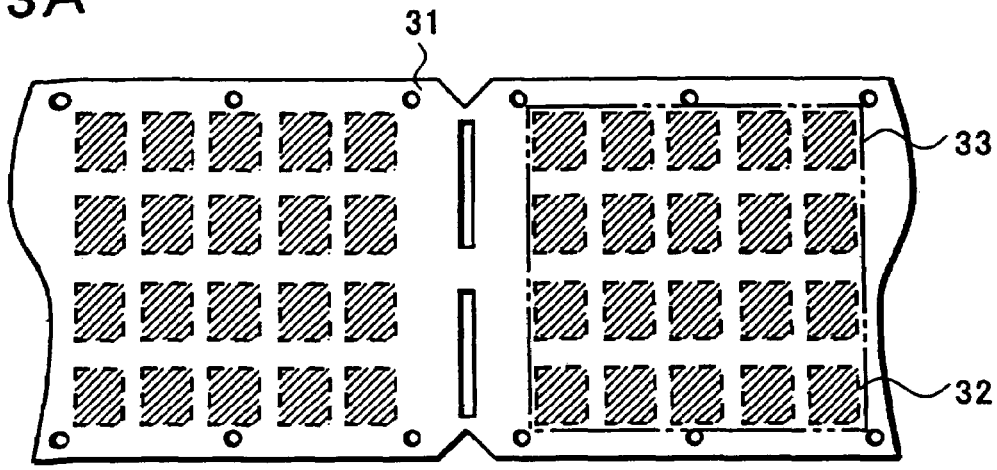
FIG. 3A is a plan view.
Figure 3B:
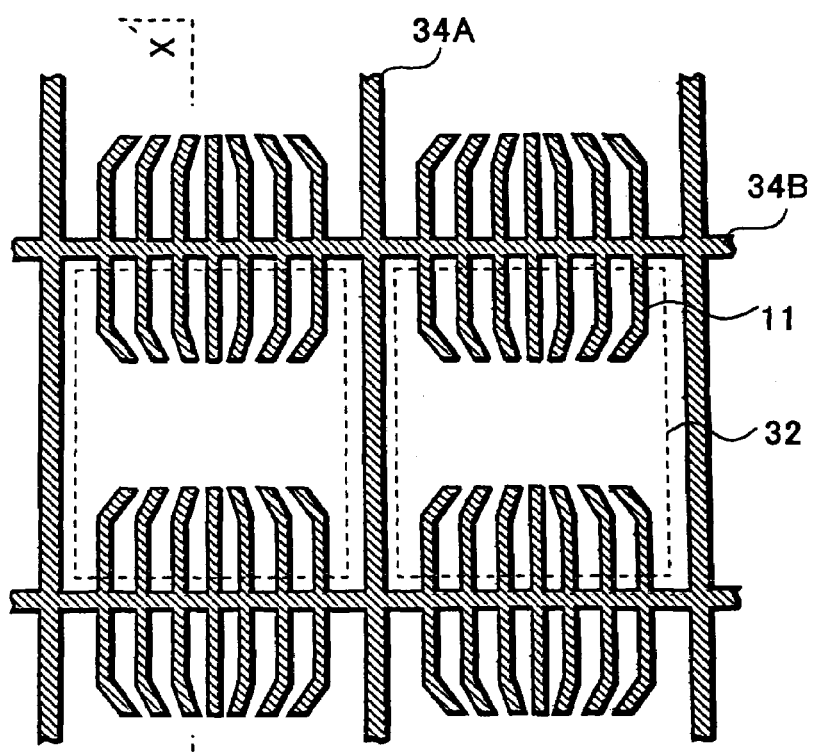
FIG. 3B is a plan view.
Figure 3C:
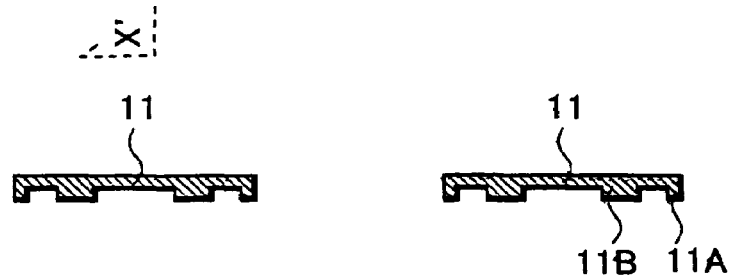
FIG. 3C is a cross-sectional view for showing a method of manufacturing the semiconductor device of the preferred embodiment.

Firstly, referring to FIGS. 3A to 3C, units 32 each including the plurality of leads 11 each having the convex portion protruding downward are formed. FIG. 3A is a plan view of a frame 31 which is a conductive foil where a plurality of blocks 33 are formed thereon, FIG. 3B is an enlarged view showing the units 32 in one of the blocks 33, and FIG. 3C is a cross-sectional view taken along the X-X' line in FIG. 3B.

Referring to FIG. 3A by processing the frame 31 which is the conductive foil made of metal such as copper, the plurality of blocks 33 are arranged separately on the frame 31 with provision of given distances therebetween. The plurality of units 32 are formed on each block in a matrix. Here, the "unit" means an element unit constituting one semiconductor device.

A concrete configuration of the above-described unit 32 will be described with reference to FIG. 3B. In the preferred embodiment of the present invention, first connecting portions 34A and second connecting portions 34B extend inside the block 33 with provision of equal spaces therebetween. Here, the first connecting portions 34A extend in the longitudinal direction of the sheet with provision of equal spaces therebetween. Meanwhile, the second connecting portions 34B extend in the perpendicular direction to the first connecting portions 34A with provision of equal spaces therebetween. The leads 11 extend in the vertical direction from the second connecting portions 34B which extend in the lateral direction. In terms of the single unit 32, the plurality of leads 11 extend from the second connecting portion 34B located on an upper part of the unit 32 to the inside (in a downward direction) of the unit. Moreover, the plurality of leads 11 extend from the second connecting portion 34B located on a lower part of the unit 32 to the inside (in an upward direction) of the unit.

A cross-sectional structure of the lead 11 will be described with reference to FIG. 3C. The lead 11 includes the first convex portions 11A on a tip end, and the second convex portions 11B in the position corresponding to the periphery of the unit 32. Moreover, the above-described frame 31 can be processed by means of pressing or etching.

Figure 4A:
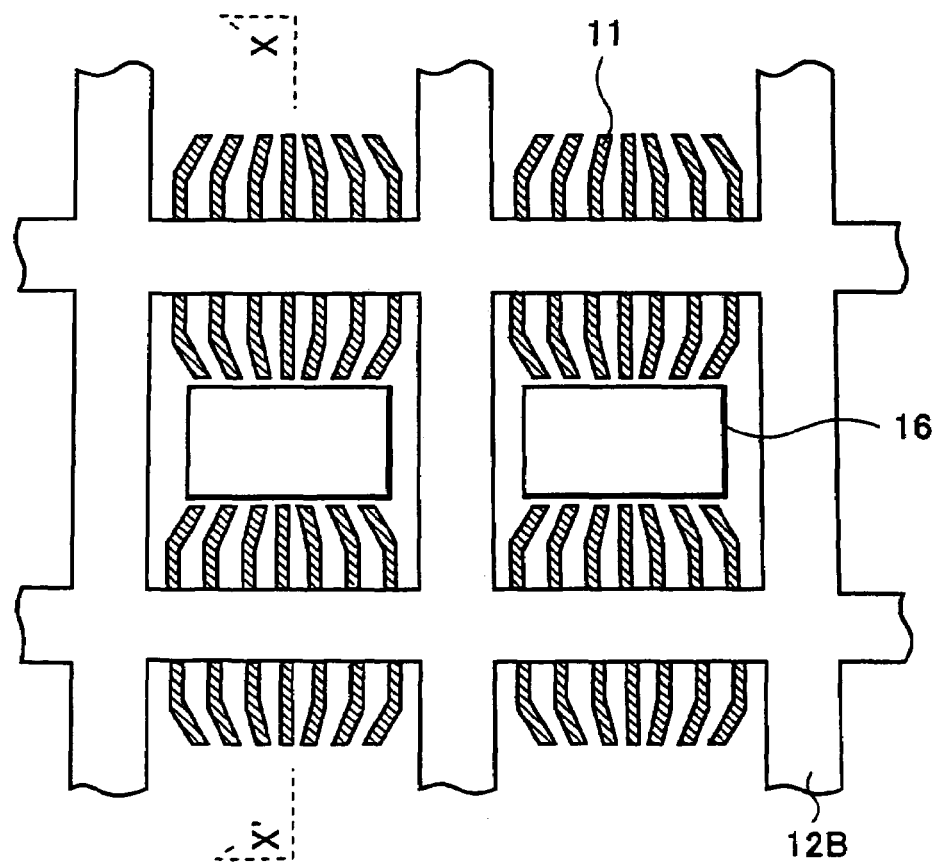
FIG. 4A is a plan view and FIG. 4B is a cross-sectional view for showing the method of manufacturing the semiconductor device of the preferred embodiment.
Figure 4B:
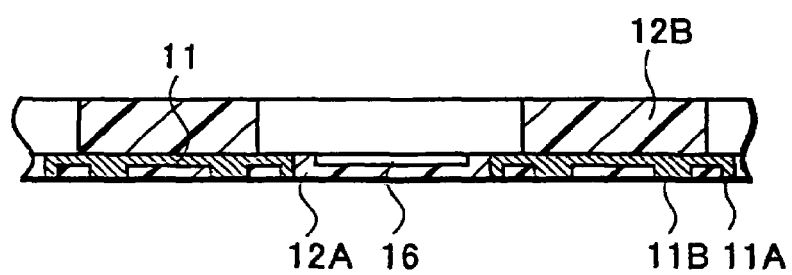

Next, referring to FIGS. 4A and 4B, the enclosure 12 including the bottom portion 12A and the side portions 12B is formed for each unit by injection molding. FIG. 4A is an enlarged view of the units 32, and FIG. 4B is a cross-sectional view taken along the X-X' line in FIG. 4A.

Here, each block is housed in one cavity and resin sealing is performed in a lump. This resin sealing can be performed by injection molding using thermoplastic resin or by transfer molding using thermosetting resin. Moreover, to form a region for housing the semiconductor element, an upper mold used in this process is formed into the shape corresponding to the shape of the inner region of the enclosure 12. That is, a convex portion having the shape which is engageable with the inner region of the enclosure 12 is formed on the upper mold configured to perform molding. At the resin sealing, the surface of the lead 11 abuts on a lower surface of the upper mold. In this way, it is possible to prevent the sealing resin from being accidentally attached to a region for electrical connection.

Meanwhile, the first convex portions 11A are provided under the region for electrical connection (a position to be connected to the metal wire) of the lead 11. Therefore, at the resin sealing, the region for electrical connection of the lead 11 abuts on the upper mold and the first convex portions 11A abut on a lower mold. In this way, the lead 11 does not move in the vertical direction. Accordingly, the above-mentioned effect can be even more enhanced.

Moreover, in this process, the concave portion 16 is formed in a region where the semiconductor element is to be mounted. The planar size of the concave portion 16 may be formed slightly greater than the semiconductor element to be mounted thereon.

Figure 5A:
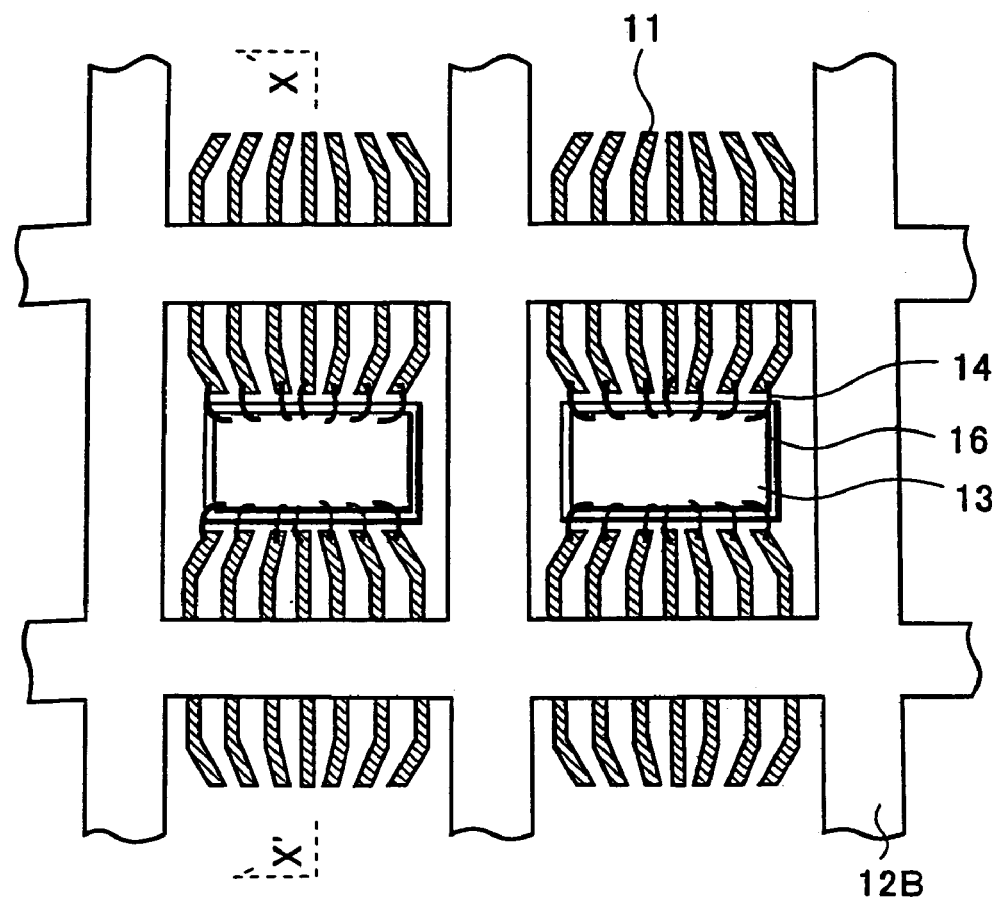
FIG. 5A is a plan view and FIG. 5B is a cross-sectional view for showing the method of manufacturing the semiconductor device of the preferred embodiment.
Figure 5B:
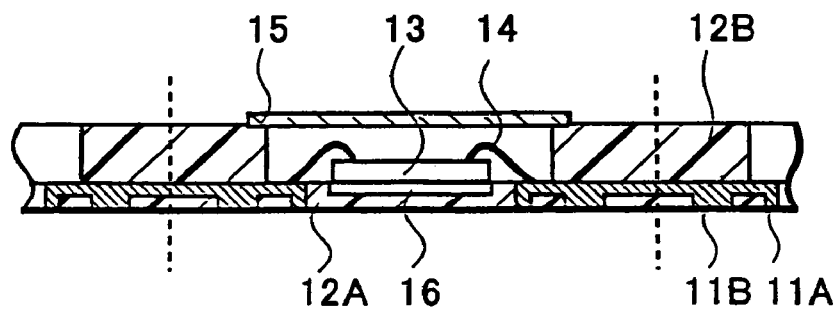
Figure 6A:
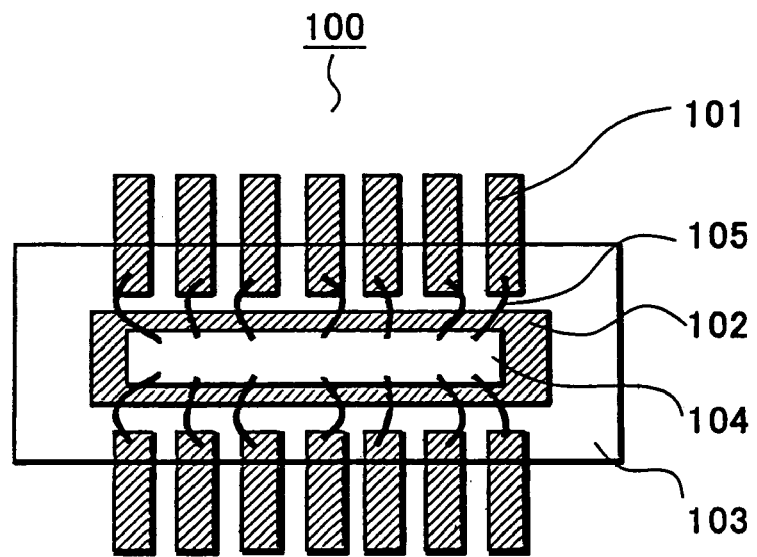
FIG. 6A is a plan view and FIG. 6B is a cross-sectional view for showing a conventional semiconductor device.
Figure 6B:
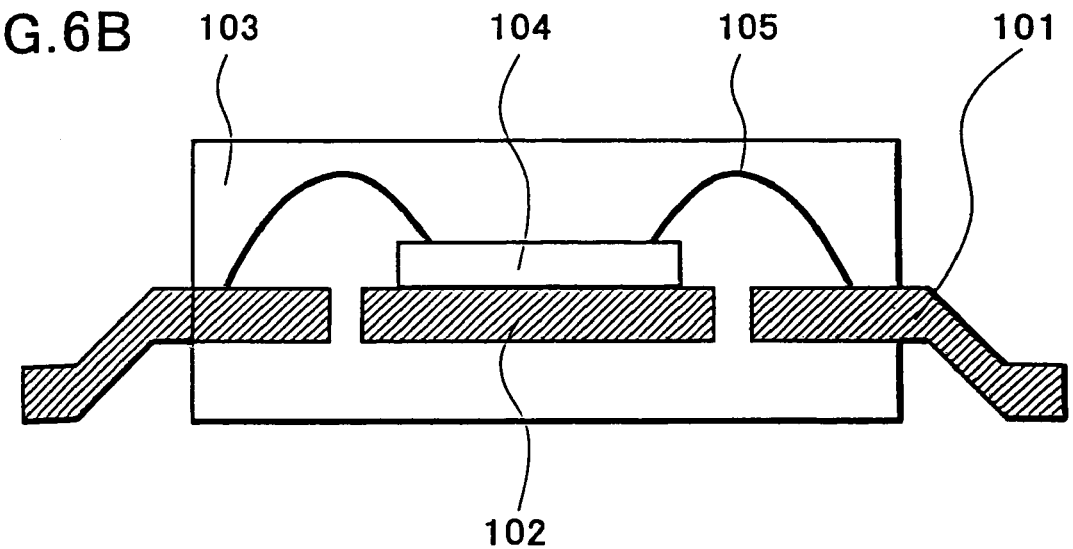

Next, referring to FIGS. 5A and 5B, the semiconductor element 13 is fixed to the bottom portion 12A. Moreover, wire bonding is performed on the surface in the vicinity of the convex portion of the leads 11, and the semiconductor element 13 is connected to the leads 11 by use of the metal wire 14. FIG. 5A is an enlarged view of the units 32, and FIG. 5B is a cross-sectional view taken along the X-X' line in FIG. 5A.

Firstly, the semiconductor element 13 is fixed to the concave portion 16 provided on the bottom portion 12A by use of an adhesive. Here, as the adhesive, it is generally possible to use insulation adhesive and the like in addition to Ag paste. By fixing the semiconductor element 13 to the concave portion 16 as described above, it is possible to prevent the overflowing adhesive from being attached to the leads 11 and the like.

Moreover, by forming the concave portion 16, it is possible to lower the position of the semiconductor element 13. Therefore, it is possible to reduce a difference in level between the surface of the semiconductor element 13 and the surfaces of the leads 11. Accordingly, it is possible to connect the semiconductor element 13 and the leads 11 easily by use of the metal wires 14. Further, it is possible to improve yields of the wire bonding process.

Next, referring to FIG. 5B, the aperture is occluded by use of the lid 15 made of the transparent material. Subsequently, each of the units 32 are separated by cutting the leads 11 and the side portions 12B off.

The aperture on an upper part of the semiconductor element is occluded by the lid 15 which is made of the transparent material such as glass. Moreover, the lid 15 may be adhered by use of the insulation adhesive. Here, each aperture is occluded by use of the lid 15 having the planar size which is slightly larger than the internal region for incorporating the semiconductor element 13. In addition, it is also possible to use the lid 15 having a sufficiently large size for occluding the entire block 33. In this case, the lid 15 is divided in the subsequent process together with other constituents.

Thereafter, by scribing the side portions 12B and the leads 11 in positions indicated by dotted lines in FIG. 5B, the units 32 are divided into respective pieces. That is, the respective leads 11 are electrically decoupled in this process. After these processes, the semiconductor element 13 as shown in FIGS. 1A to 1C is finished.

The preferred embodiments of the present invention can exhibit the following effects.

The semiconductor element is housed in the enclosure made of resin, and the transparent lid is formed so as to occlude the aperture of this enclosure. This lid has high transparency for transmitting light accepted or emitted by the semiconductor element. Accordingly, it is possible to prevent degradation of an optical signal attributable to the sealing member.

Moreover, in terms of the manufacturing method, the first convex portion is provided under the position to be the region for electrical connection. The upper surface of this region abuts on the upper mold, and the first convex portion abuts on the lower mold. Therefore, it is possible to prevent the sealing resin from being attached to the region for electrical connection of the lead in the course of the molding process.

What is claimed is:

1. A semiconductor device comprising:
an enclosure including a bottom portion and side portions and having an aperture on an upper part thereof;
a semiconductor element fixed to a surface of the bottom portion and having at least one of a light accepting portion or a light emitting portion;
a plurality of leads buried in the bottom portion and arranged so that a first end thereof approaches the semiconductor element;
conductive wires to connect the semiconductor element to each lead; and
a lid that occludes the aperture and that is transparent to at least one of light received by the light accepting portion or light emitted by the light emitting portion,
wherein each lead includes different first and second convex portions exposed at the bottom portion of the enclosure, and the first and second convex portions are on each lead, wherein the first convex portion of each lead is directly under a region where the conductive wire is connected to the lead and wherein a distance between respective first convex portions is less than a distance between respective second convex portions.

2. The semiconductor device according to claim 1, wherein each lead is partially exposed from a rear surface of the bottom portion to form an external electrode.

3. The semiconductor device according to claim 1, wherein a concave portion is provided on a surface of the bottom portion of the enclosure, and the semiconductor element is fixed to the bottom portion by an adhesive on the concave portion.

4. The semiconductor device according to claim 1, wherein the lid comprises glass.

5. The semiconductor device of claim 1 wherein a second end of each lead is exposed at one of the side portions of the enclosure.

6. The semiconductor device according to claim 1 wherein only rear surfaces of the first and second convex portions are exposed from the enclosure.

* * * * *